US012189151B2

(12) United States Patent
Kim et al.

(10) Patent No.: US 12,189,151 B2
(45) Date of Patent: Jan. 7, 2025

(54) OPTICAL LAMINATE

(71) Applicant: LG Chem, Ltd., Seoul (KR)

(72) Inventors: Beom Su Kim, Daejeon (KR); Hae Sung Cho, Daejeon (KR); So Ra Yoon, Daejeon (KR); Nah Reen Kwak, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 17/633,258

(22) PCT Filed: Sep. 11, 2020

(86) PCT No.: PCT/KR2020/012295
§ 371 (c)(1),
(2) Date: Feb. 7, 2022

(87) PCT Pub. No.: WO2021/049903
PCT Pub. Date: Mar. 18, 2021

(65) Prior Publication Data
US 2022/0365257 A1 Nov. 17, 2022

(30) Foreign Application Priority Data
Sep. 11, 2019 (KR) .................. 10-2019-0112705

(51) Int. Cl.
G02B 5/02 (2006.01)
G02B 1/11 (2015.01)
H10K 59/50 (2023.01)

(52) U.S. Cl.
CPC .............. *G02B 5/0242* (2013.01); *G02B 1/11* (2013.01); *H10K 59/50* (2023.02)

(58) Field of Classification Search
None
See application file for complete search history.

(56) References Cited

U.S. PATENT DOCUMENTS

| 7,156,530 | B2 | 1/2007 | Miyatake et al. |
| 7,852,435 | B2 | 12/2010 | Fujisawa et al. |
| 2005/0163977 | A1 | 7/2005 | Miyatake et al. |
| 2006/0286381 | A1 | 12/2006 | Naito et al. |
| 2009/0103018 | A1* | 4/2009 | Matsumori ....... G02F 1/134363 349/96 |
| 2011/0164209 | A1* | 7/2011 | Yoshihara ............... G02B 1/111 359/488.01 |

(Continued)

FOREIGN PATENT DOCUMENTS

| CN | 1324329 C | 7/2007 |
| JP | 2003001703 A | 1/2003 |

(Continued)

OTHER PUBLICATIONS

Search report from International Application No. PCT/KR2020/012295, mailed Dec. 16, 2020.

(Continued)

*Primary Examiner* — Anthony J Frost
(74) *Attorney, Agent, or Firm* — Lerner David LLP

(57) ABSTRACT

An optical laminate is provided. When the optical laminate is applied to an OLED display device, the problem of visibility due to reflection of external incident natural light of the device can be solved, and simultaneously its display quality can also be improved.

17 Claims, 1 Drawing Sheet

(56) References Cited

U.S. PATENT DOCUMENTS

| | | | | | |
|---|---|---|---|---|---|
| 2017/0125728 | A1* | 5/2017 | Dighde | ............... | H01L 51/5262 |
| 2018/0106929 | A1* | 4/2018 | Song | .................... | B05D 3/0254 |
| 2018/0252968 | A1* | 9/2018 | Nakamura | ........... | G02B 6/0056 |

FOREIGN PATENT DOCUMENTS

| | | | |
|---|---|---|---|
| JP | 2003237006 | A | 8/2003 |
| KR | 20070103180 | A | 10/2007 |
| KR | 20090003834 | A | 1/2009 |
| KR | 20170042509 | A | 4/2017 |
| KR | 20170106226 | A | 9/2017 |
| KR | 101953775 | B1 | 3/2019 |
| TW | I359280 | B | 3/2012 |

OTHER PUBLICATIONS

Search Report dated Nov. 23, 2023 from the Office Action for Chinese Application No. 202080049594.9 issued Nov. 25, 2023, 3 pages.

\* cited by examiner

[Figure 1]
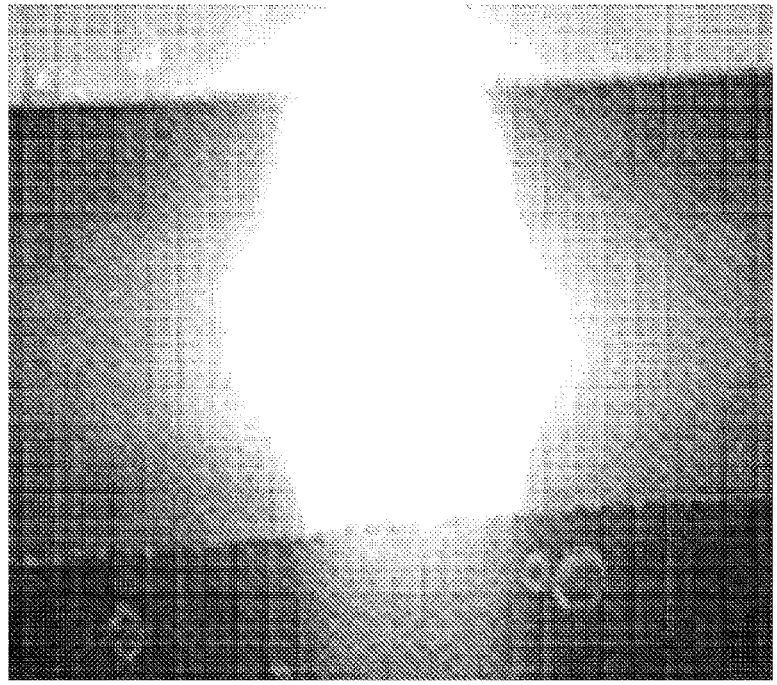
[Figure 2]
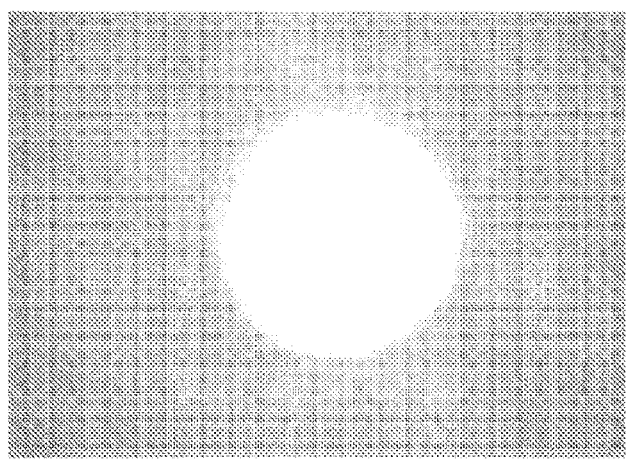

OPTICAL LAMINATE

CROSS-REFERENCE TO RELATED APPLICATION

The present application is a National Phase entry under 35 U.S.C. § 371 of International Application No PCT/KR2020/012295 filed Sep. 11, 2020 which claims priority from Korean Patent Application No. 10-2019-0112705 filed with the Korean Intellectual Property Office on Sep. 11, 2019, the disclosures of which are incorporated herein by reference in their entirety.

TECHNICAL FIELD

The present application relates to an optical laminate.

BACKGROUND ART

In an organic light emitting diode (OLED) display device, the external incident light is reflected from the device, so that there is a problem that the visibility of the device decreases. To solve this problem, a circularly polarizing plate has been used conventionally. Specifically, the conventional design method is to prevent the user from recognizing natural light incident from the outside even if the light is reflected from the OLED display device by sequentially laminating a retardation film and a linearly polarizing plate on the side of the device (this laminated structure is the circularly polarizing plate). The natural light (non-polarized light) incident from the outside is linearly polarized (90 degrees) with the linearly polarizing plate, the linearly polarized light is circularly polarized (135 degrees) through the retardation film, and the light (135 degrees) reflected by a glass substrate or a reflective electrode, and the like, in the OLED display device is linearly polarized (180 degrees) through the retardation film again. At this time, since the linearly polarizing plate transmits only the light polarized at 90 degrees, the light reflected from the OLED display device is not visible from the outside. However, the method of applying the circularly polarizing plate has a problem of lowering the transmittance or luminance of the display device.

To solve the above problem of visibility due to reflection of externally incident natural light, a method of sequentially laminating a transmittance control layer capable of exhibiting a specific range of transmittance and an antireflection layer having low reflectance on the OLED display device was considered, with excluding the application of a polarizing plate such as a circularly polarizing plate. However, since no polarizing plate is applied in this method, display defects such as observation of diffraction fringes on the viewer side surface of the OLED display device are caused.

DISCLOSURE

Technical Problem

It is one object of the present application to provide an optical laminate that when it has been applied to an OLED display device, the problem of visibility due to reflection of external incident natural light of the device can be solved, and simultaneously its display quality can also be improved.

Technical Solution

In the present application, wavelengths based on measurement of optical properties such as refractive index, transmittance, haze and reflectance are separately defined in the corresponding properties.

The present application relates to an optical laminate.

The optical laminate of the present application comprises at least a pressure-sensitive adhesive layer, a transmittance control layer and an antireflection layer.

The optical laminate may comprise the layers in the above-described order. That is, in the optical laminate of the present application, the pressure-sensitive adhesive layer may be positioned on the opposite side of the antireflection layer based on the transmittance control layer. Specifically, the optical laminate of the present application may comprise a pressure-sensitive adhesive layer, a transmittance control layer disposed on the pressure-sensitive adhesive layer, and an antireflection layer disposed on the transmittance control layer.

The optical laminate of the present application comprising the functional layers designed to have physical properties as described below has advantages that when it has been applied to a display device such as an OLED display, it is possible to improve the display quality of the device, while solving the problem of lowering visibility due to reflection of external incident natural light in the device.

In the optical laminate of the present application, the pressure-sensitive adhesive layer has haze of 40% or more. The haze of the pressure-sensitive adhesive layer is measured according to the standard of JIS K7105.

In the optical laminate of the present application, the transmittance control layer has transmittance for light with a wavelength in a range of 380 nm to 780 nm in a range of 10% to 80%.

In the optical laminate of the present application, the antireflection layer has reflectance of 2% or less for light with a wavelength in a range of 380 nm to 780 nm.

Hereinafter, each of the functional layers will be described in more detail.

The optical laminate of the present application comprises a pressure-sensitive adhesive layer that satisfies specific optical properties. In the present application, the term "pressure-sensitive adhesion" refers to a function capable of attaching specific members according to the application of an external force and removing them as necessary, like the known meaning.

As described above, the pressure-sensitive adhesive layer has haze of 40% or more as measured according to the standard of JIS K7105. That is, the light transmitted through the pressure-sensitive adhesive layer may be perceived relatively cloudily. In another example, the haze of the pressure-sensitive adhesive layer may be 45% or more, 50% or more, or 55% or more, and may be 80% or less, 75% or less, or 70% or less.

The pressure-sensitive adhesive layer comprises a pressure-sensitive adhesive resin and light scattering particles. The pressure-sensitive adhesive resin can impart the pressure-sensitive adhesive performance of the pressure-sensitive adhesive layer, and the light scattering particles can serve to exhibit the optical properties (for example, haze).

The pressure-sensitive adhesive resin and the light scattering particles of the pressure-sensitive adhesive layer have different refractive indices. Usually, the refractive index of the pressure-sensitive adhesive resin is greater than the refractive index of the light scattering particles. Since the pressure-sensitive adhesive layer may comprise materials having different refractive indices to induce birefringence of light incident thereon, the pressure-sensitive adhesive layer may scatter light incident thereon. As a result, the light transmitted through the pressure-sensitive adhesive layer is perceived relatively cloudily. The physical property quantified therefrom is the aforementioned haze.

In the present application, the refractive index of the specific member or substance, and the like, as mentioned, may be measured using a known ellipsometer according to the manufacturer's manual.

In one example, the pressure-sensitive adhesive resin may have a refractive index of 1.45 or more for light with a wavelength in a range of 600 nm to 650 nm. In another example, the measurement wavelength of the refractive index may be 610 nm or more, 620 nm or more, or 630 nm or more, and may be 645 nm or less, 640 nm or less, or 635 nm or less. In another example, the refractive index of the adhesive resin may be in the range of 1.45 to 1.46.

The kind of the adhesive resin is not particularly limited. As long as the pressure-sensitive adhesive resin is a pressure-sensitive adhesive resin capable of having the above-described refractive index, the kind is not particularly limited, and a typical pressure-sensitive adhesive resin is an acrylic copolymer, which may be applied in the present application. In the case where the acrylic copolymer is applied as the pressure-sensitive adhesive resin in the present application, the composition may be controlled to exhibit the aforementioned refractive index.

In the present application, the term "acrylic copolymer" may mean a polymer comprising an ester of acrylic acid or methacrylic acid as a polymerized unit.

In the present application, the term "polymerized unit of a monomer" may mean a skeleton constituting a polymer when the monomer forms the polymer.

The acrylic copolymer may comprise a polymerized unit of an alkyl (meth)acrylate monomer and a polymerized unit of a polar functional group-containing monomer. Here, the "(meth)acrylate" means acrylate or methacrylate.

In one example, an appropriate type may be selected as the alkyl (meth)acrylate monomer in consideration of the cohesive force, glass transition temperature or tackiness, and the like of the pressure-sensitive adhesive. For example, as the alkyl (meth)acrylate monomer, an alkyl (meth)acrylate monomer having an alkyl group having 4 or more carbon atoms, for example, an alkyl group having 4 to 14 carbon atoms may be used. Such an alkyl (meth)acrylate monomer may be exemplified by a monomer, such as n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate and tetradecyl (meth)acrylate, and one of the foregoing may be applied, or two or more may be applied in combination.

In another example, as the alkyl (meth)acrylate monomer, an alkyl (meth)acrylate monomer having an alkyl group having 3 or less carbon atoms may also be used, in addition to an alkyl (meth)acrylate monomer having an alkyl group having 4 or more carbon atoms. This may be applied in place of an alkyl (meth)acrylate monomer having an alkyl group having 4 or more carbon atoms as the above-described alkyl (meth)acrylate monomer, and may also be applied together with the monomer. Such a monomer is advantageous in securing excellent endurance reliability of the pressure-sensitive adhesive at high temperatures. An example of alkyl (meth)acrylate monomers having an alkyl group having 3 or less carbon atoms may include methyl (meth)acrylate, ethyl (meth)acrylate, n-propyl (meth)acrylate or isopropyl (meth)acrylate, and the like.

In terms of the fact that the pressure-sensitive adhesive resin has the aforementioned refractive index and secure compatibility with light scattering particles, n-butyl acrylate may be applied as the alkyl (meth)acrylate monomer.

The ratio of the alkyl (meth)acrylate monomer in the acrylic copolymer is not particularly limited. For example, the acrylic copolymer may comprise a polymerized unit of the alkyl (meth)acrylate monomer as a main component.

In the present application, the fact that any object comprises the other object as a main component may mean that the content of the other component is 60 wt % or more, based on the total weight of all components including the object and the other object. In another example, the content may be 65 wt % or more, 70 wt % or more, 75 wt % or more, 80 wt % or more, 85 wt % or more, or 90 wt % or more, and about 100 wt %, 99 wt % or less, 98 wt % or less, 97% wt % or less, 96 wt % or less, or 95 wt % or less.

In one example, as the monomer having a polar functional group, a monomer having a hydroxy group or a carboxyl group may be used. Such a monomer may play a role of imparting the cohesive force or the like to the acrylic copolymer through reaction with a crosslinking agent to be described below, if necessary.

In terms of securing appropriate cohesive force and durability of the pressure-sensitive adhesive layer, a carboxyl group-containing monomer or a hydroxyalkyl (meth)acrylate monomer having a hydroxyalkyl group with 3 to 6 carbon atoms may be used as the polar functional group-containing monomer.

As a hydroxyalkyl (meth)acrylate monomer having a hydroxyalkyl group with 3 to 6 carbon atoms, hydroxypropyl (meth)acrylate, 4-hydroxybutyl (meth)acrylate or 6-hydroxyhexyl (meth)acrylate, and the like may be exemplified.

The carboxyl group-containing monomer may include (meth)acrylic acid, 2-(meth)acryloyloxy acetic acid, 3-(meth)acryloyloxy propyl acid, 4-(meth)acryloyloxy butyric acid, an acrylic acid dimer, itaconic acid, maleic acid and maleic anhydride, and the like, among which acrylic acid is usually applied.

The ratio of the polymerized unit of the polar functional group-containing monomer in the acrylic copolymer is not particularly limited, which may be appropriately adjusted in terms of securing appropriate cohesive force of the pressure-sensitive adhesive layer. The acrylic copolymer may comprise the polymerized unit of the polar functional group-containing monomer in a content in a range of 1 part by weight to 20 parts by weight relative to 100 parts by weight of the polymerized unit of the alkyl (meth)acrylate monomer. In another example, the content may be 3 parts by weight or more, 4 parts by weight or more, 5 parts by weight or more, or 6 parts by weight or more, and may be 15 parts by weight or less, 10 parts by weight or less, or 8 parts by weight or less. The acrylic copolymer may also be comprised of the polymerized unit of the alkyl (meth)acrylate monomer and the polymerized unit of the polar functional group-containing monomer.

The method of preparing the acrylic copolymer is not particularly limited. The acrylic copolymer can be prepared by a known polymerization method using the above-mentioned monomers. For example, the acrylic copolymer can be prepared by applying a known polymerization method (for example, application of heat or irradiation with light) to a monomer mixture comprising the above-mentioned monomers.

In the process of preparing the acrylic copolymer, a known polymerization initiator may also be applied. For example, when the acrylic copolymer is prepared by a thermal polymerization method, the acrylic copolymer may be prepared by adding a thermal polymerization initiator to a monomer mixture comprising the above-mentioned monomers and applying heat to the mixture. In addition, when the acrylic copolymer is prepared by a photopolymerization method, the acrylic copolymer may be prepared by adding a photopolymerization initiator to a monomer mixture comprising the above-mentioned monomers and irradiating the mixture with light. The types and contents of the photopolymerization initiator and/or the thermal polymerization initiator are not particularly limited, and known components and appropriate contents may be applied in terms of securing the appropriate cohesive force and refractive index of the acrylic copolymer.

The pressure-sensitive adhesive layer further comprises light scattering particles having a refractive index different from that of the pressure-sensitive adhesive resin, in addition to the adhesive resin. In the present application, the term "light scattering particles" may mean a material in the form of particles having a property capable of scattering incident light.

As described above, the light scattering particles may have a refractive index different from that of the pressure-sensitive adhesive resin, and specifically, may have a refractive index lower than that of the pressure-sensitive adhesive resin. At this time, the absolute value of the difference between the refractive index of the light scattering particles and the refractive index of the pressure-sensitive adhesive resin may be in a range of 0.01 to 0.5. In another example, the value may be 0.03 or more, or 0.04 or more, and may be 0.4 or less, or 0.3 or less.

The type of light scattering particles may be appropriately selected in consideration of compatibility with other components to be mixed with the particles.

A specific example of the light scattering particles may include particles made of organic materials such as an acrylic resin, a styrene resin, an acrylic-styrene copolymer, a urethane resin, a melamine resin, a benzoguanamine resin, an epoxy resin, a silicone resin or polyethylene; or particles made of inorganic materials such as silica, titanium oxide ($TiO_2$), magnesium fluoride ($MgF_2$), zirconium oxide ($ZrO_2$), aluminum oxide ($Al_2O_3$) or glass, and the like, but is not limited thereto. Here, the acrylic resin, styrene resin or urethane resin, and the like may form particles in a crosslinked or non-crosslinked state.

As the light scattering particles, for example, benzoguanamine-formaldehyde condensate (EPOSTAR M30: refractive index 1.66), melamine-formaldehyde condensate (EPOSTAR, refractive index 1.66) and a poly(methyl methacrylate)-based crosslinked product (EPOSTAR MX, refractive index 1.49) manufactured by Nippon Shokubai, crosslinked poly(methyl methacrylate) (MBX, refractive index 1.49) manufactured by SEKISUI CHEM., polystyrene resin-based beads (KSR-3, refractive index 1.59) and crosslinked polystyrene (SBX, refractive index 1.59) manufactured by Soken Chemical Company, a silicone resin (Tospearl 145, refractive index 1.42) manufactured by TOSHIBA SILICON, an epoxy resin (Toray pearl, refractive index 1.59) manufactured by TORAY, polystyrene-based beads (GS-04595-6, refractive index 1.59) manufactured by Ganz, or polystyrene-based beads (HR-59-40, refractive index 1.59) manufactured by Sunjin Chemical Co. Ltd., and the like may be used, without being limited thereto.

In consideration of compatibility with the pressure-sensitive adhesive resin, it is advantageous to apply particles made of the silicone resin.

In addition, the shape of the particles is not limited, which may be any shape such as spheres, polyhedrons or amorphous shapes, but preferably may be spheres. In this case, the sphere also includes a geometrically complete sphere as well as a substantial or approximate sphere.

In one example, the refractive index of the light scattering particles may be maintained lower than the refractive index of the acrylic copolymer, and for example, may be less than 1.45 for light having a wavelength in the range of 600 nm to 650 nm. In another example, the measurement wavelength of the refractive index may be 610 nm or more, 620 nm or more, or 630 nm or more, and may be 645 nm or less, 640 nm or less, or 635 nm or less. In another example, the refractive index of the light scattering particles may be 1.44 or less, 1.40 or more, 1.41 or more, or 1.42 or more.

The refractive index of the light scattering particles may vary depending on the type or shape of the particles, or the size according to the shape, and the like, which may be measured using a known ellipsometer, and in some cases, it is also easily available from the product information of the applied light scattering particles.

From the viewpoint of constituting the pressure-sensitive adhesive layer so as to satisfy the above-described optical properties (for example, haze), the characteristics of the light scattering particles, for example, the size may be adjusted. For example, the light scattering particles may have an average particle diameter in a range of 1 μm to 20 μm. Here, the particle diameter of the light scattering particles may be the particle length in the longest axis direction or the particle length in the shortest axis direction, and the average particle diameter may also be an arithmetic average of the length in the longest axis direction and the length in the shortest axis direction. In another example, the average particle diameter may be a particle diameter measured according to a known average particle size, for example, a D50 particle diameter.

In another example, the average particle diameter may be 1.5 μm or more, 2 μm or more, 2.5 μm or more, 3 μm or more, 3.5 μm or more, 4 μm or more, or 4.5 μm or more, and may be 15 μm or less, 10 μm or less, 9 μm or less, 8 μm or less, 7 μm or less, 6 μm or less, or 5 μm or less.

The content of the light scattering particles in the pressure-sensitive adhesive layer is also not particularly limited. As will be described below, the pressure-sensitive adhesive layer of the present application may be formed of a pressure-sensitive adhesive composition having a specific composition, and the content of the pressure-sensitive adhesive resin and the light scattering particles may be the content in the pressure-sensitive adhesive composition or the content in the pressure-sensitive adhesive layer.

The pressure-sensitive adhesive layer of the present application may comprise the light scattering particles in a content in a range of 1 part by weight to 30 parts by weight relative to 100 parts by weight of the pressure-sensitive adhesive resin. In another example, the content may be 2 parts by weight or more, 3 parts by weight or more, 4 parts by weight or more, 5 parts by weight or more, 6 parts by weight or more, 7 parts by weight or more, 8 parts by weight or more, or 9 parts by weight or more, and may be 25 parts by weight or less, 20 parts by weight or less, 15 parts by weight or less, 14 parts by weight or less, 13 parts by weight or less, 12 parts by weight or less, 11 parts by weight or less, or 10 parts by weight or less.

The method of forming the pressure-sensitive adhesive layer is not particularly limited. For example, the pressure-sensitive adhesive layer of the present application may be prepared by using, specifically curing, the pressure-sensitive adhesive composition having a specific composition. Therefore, the pressure-sensitive adhesive layer of the present application may be a cured product of the pressure-sensitive adhesive composition. Here, the "pressure-sensitive adhesive composition" may mean a composition exhibiting pressure-sensitive adhesive properties before or after curing and/or crosslinking.

As described above, the pressure-sensitive adhesive layer comprises the aforementioned pressure-sensitive adhesive resin and light scattering particles, and the pressure-sensitive adhesive layer may be formed of a pressure-sensitive adhesive composition, so that the pressure-sensitive adhesive composition may also comprise the pressure-sensitive adhesive resin and light scattering particles, and the contents of the type, content, and the like may be equally applied to the pressure-sensitive adhesive composition. In addition, the optical properties (for example, haze) of the pressure-sensitive adhesive layer can be achieved by adjusting the composition of the pressure-sensitive adhesive composition.

The pressure-sensitive adhesive composition applied in the present application may comprise additional components in addition to the pressure-sensitive adhesive resin and light scattering particles. An example of the representative additional components may include a crosslinking agent. That is, the pressure-sensitive adhesive composition may further comprise a crosslinking agent. In this case, the pressure-sensitive adhesive layer may further comprise the crosslinking agent. At this time, the crosslinking agent in the pressure-sensitive adhesive layer may crosslink the pressure-sensitive adhesive resin.

As the crosslinking agent, a known crosslinking agent may be applied without limitation. Various types of crosslinking agents are known in the pressure-sensitive adhesive field. As typical crosslinking agents, isocyanate-based crosslinking agents, epoxy-based crosslinking agents, aziridine-based crosslinking agents, and metal chelate-based crosslinking agents, and the like are known. In the present application, two or more of the foregoing, specifically, an isocyanate-based crosslinking agent and an epoxy-based crosslinking agent have been used in combination.

As the isocyanate-based crosslinking agent, diisocyanates such as toluene diisocyanate, xylene diisocyanate, diphenylmethane diisocyanate, hexamethylene diisocyanate, isophorone diisocyanate, tetramethylxylene diisocyanate or naphthalene diisocyanate, or a reaction product of one or more of the above diisocyanates and a polyol (for example, trimethylol propane), and the like may be used.

As the epoxy-based crosslinking agent, one or more selected from the group consisting of ethylene glycol diglycidyl ether, triglycidyl ether, trimethylolpropane triglycidyl ether, N,N,N',N'-tetraglycidyl ethylenediamine and glycerin diglycidyl ether may be used, and as the aziridine-based crosslinking agent, one or more selected from the group consisting of N,N-toluene-2,4-bis(1-aziridinecarboxamide), N,N'-diphenylmethane-4,4'-bis(1-aziridinecarboxamide), triethylene melamine, bisisophthaloyl-1-(2-methylaziridine) and tri-1-aziridinylphosphine oxide may be used, and as the metal chelate-based crosslinking agent, a compound in which a polyvalent metal such as aluminum, iron, zinc, tin, titanium, antimony, magnesium and/or vanadium is coordinated with acetyl acetone or ethyl acetoacetate may be used.

The content of the crosslinking agent may be appropriately adjusted in terms of properly maintaining the cohesive force, adhesion, and endurance reliability of the pressure-sensitive adhesive layer. For example, the content of the crosslinking agent may be in a range of 0.001 parts by weight to 10 parts by weight relative to 100 parts by weight of the pressure-sensitive adhesive resin. In another example, the content may be 0.01 parts by weight or more, 0.05 parts by weight or more, 0.1 parts by weight or more, 0.3 parts by weight or more, 0.5 parts by weight or more, 0.7 parts by weight or more, or 0.9 parts by weight or more, and may be about 9 parts by weight or less, 8 parts by weight or less, 7 parts by weight or less, 6 parts by weight or less, 5 parts by weight or less, 4 parts by weight or less, 3 parts by weight or less, 2 parts by weight or less, 1.5 parts by weight or less, or 1 part by weight or less.

As described above, when an isocyanate-based crosslinking agent and an epoxy-based crosslinking agent are used in combination as the crosslinking agent, the content may be further controlled. In this case, the content of the isocyanate-based crosslinking agent may be in the range of 0.1 parts by weight to 5 parts by weight relative to 100 parts by weight of the pressure-sensitive adhesive resin. In another example, the content of the isocyanate-based crosslinking agent may be 0.5 parts by weight or more, 0.6 parts by weight or more, 0.7 parts by weight or more, 0.8 parts by weight or more, or 0.9 parts by weight or more, and may be 4.5 parts by weight or less, 4 parts by weight or less, 3.5 parts by weight or less, 3 parts by weight or less, 2.5 parts by weight or less, 2 parts by weight or less, 1.5 parts by weight or less, or 1 part by weight or less. In addition, the content of the epoxy-based crosslinking agent may be in the range of 0.001 parts by weight to 0.01 parts by weight relative to 100 parts by weight of the pressure-sensitive adhesive resin. In another example, the content of the epoxy-based crosslinking agent may be 0.002 parts by weight or more, 0.003 parts by weight or more, 0.004 parts by weight or more, or 0.005 parts by weight or more, and may be 0.009 parts by weight or less, 0.008 parts by weight or less, 0.007 parts by weight or less, 0.006 parts by weight or less, or 0.005 parts by weight or less.

The pressure-sensitive adhesive composition may also comprise other known additives, in addition to the above-described components. Such additives may include coupling agents such as silane coupling agents, antistatic agents, tackifiers, ultraviolet stabilizers, antioxidants, toning agents, reinforcing agents, fillers, antifoaming agents, surfactants, photopolymerizable compounds (multifunctional acrylates, etc.), and plasticizers, and the like.

When a silane coupling agent or the like is applied as the additive, the content in the pressure-sensitive adhesive composition or the pressure-sensitive adhesive layer may also be appropriately adjusted. The content of the silane coupling agent may be in the range of 0.01 parts by weight to 5 parts by weight relative to 100 parts by weight of the pressure-sensitive adhesive resin. In another example, the content may be 0.05 parts by weight or more, or 0.1 parts by weight or more, and may be 4 parts by weight or less, 3 parts by weight or less, 2 parts by weight or less, 1 part by weight or less, or 0.5 parts by weight or less.

In the present application, the refractive index of the pressure-sensitive adhesive layer may also be adjusted. The pressure-sensitive adhesive layer may have a refractive index of 1.45 or more for light with a wavelength in a range of 600 nm to 650 nm. In another example, the measurement wavelength of the refractive index may be 610 nm or more, 620 nm or more, or 630 nm or more, and may be 645 nm or less, 640 nm or less, or 635 nm or less. In another example, the refractive index of the pressure-sensitive adhesive layer may be in the range of 1.45 to 1.46. The refractive index of the pressure-sensitive adhesive layer may be adjusted by the type and content, and the like of components included in the pressure-sensitive adhesive layer or the pressure-sensitive adhesive composition for forming the pressure-sensitive adhesive layer.

In one example, the thickness of the pressure-sensitive adhesive layer may also be appropriately adjusted. For example, the above-described optical properties such as haze may also be controlled by the thickness of the pressure-sensitive adhesive layer. The thickness of the pressure-sensitive adhesive layer may be, for example, in a range of 1 μm to 30 μm. In another example, the thickness of the pressure-sensitive adhesive layer may be 3 μm or more, 5 μm or more, 7 μm or more, or 9 μm or more, and may be 25 μm or less, 20 μm or less, 15 μm or less, 13 μm or less, or 10 μm or less.

In the present application, the thickness of a specific member has the same known meaning, and its measurement method may also be measured by applying a known method, for example, a method of analyzing an image obtained through tomography, and the like.

The optical laminate of the present application further comprises a transmittance control layer together with the pressure-sensitive adhesive layer. Here, the transmittance control layer may literally mean a layer that transmittance for specific light can be adjusted.

As described above, the transmittance of the transmittance control layer is in a specific range. Specifically, the transmittance of the transmittance control layer for light in a wavelength range of 380 nm to 780 nm is in a range of 10% to 80%. In the present application, by appropriately adjusting the transmittance in the above range, the light quantity of natural light incident on the display device (for example, OLED display device, etc.) to which the optical laminate is applied may be adjusted, and simultaneously, the light quantity of light reflected from the device may also be controlled, so that it is possible to solve the above-described problem of visibility due to reflection of externally incident natural light. In another example, the transmittance may be 15% or more, 20% or more, 25% or more, or 30% or more, and may be 75% or less, 70% or less, 65% or less, or 60% or less.

In the present application, the transmittance of any member may mean a ratio (LT/LI) of the light quantity (LT) of light transmitted through the member to the light quantity (LI) of light incident on the member represented as a percentage. The transmittance may be measured using a known spectrophotometer according to the manufacturer's manual of the equipment. For example, the transmittance of the transmittance control layer may mean the average transmittance of the transmittance continuously measured in the wavelength range as described above, that is, in the wavelength range of 480 nm to 780 nm.

The manner that the transmittance control layer exhibits transmittance in the above-described range is not particularly limited. For example, the transmittance may be adjusted by controlling the type and composition of components applied to the transmittance control layer.

In one example, the transmittance control layer may comprise a binder resin and a dye. Specifically, the transmittance control layer may comprise a binder resin and a dye dispersed or dissolved in the binder resin. In the present application, the term "dye" may be a compound capable of absorbing light in a wavelength band having a specific color.

As long as the binder resin is a polymer component capable of supporting a specific layer, any known component may be applied without limitation. For example, the same acrylic copolymer as the pressure-sensitive adhesive resin applied to the pressure-sensitive adhesive layer may also be applied as the binder resin of the transmittance control layer. That is, the above description of the pressure-sensitive adhesive resin is equally applicable to the binder resin.

As the dye, a dye capable of absorbing light in a wavelength band representing red, green, blue and/or yellow light may be applied. From the viewpoint of obtaining a transmittance control layer exhibiting transmittance in the above-described range, it may be advantageous to apply all of the four dyes. The transmittance of the transmittance control layer may vary depending on the components and contents of the above-described binder resin and dye, and in the present application, the type and ratio of the components may be appropriately adjusted so that the transmittance control layer may have the transmittance range as described above.

The dye may control the color of the transmittance control layer and effectively suppress the occurrence of whitening and yellowing phenomena. The specific type of the dye is not particularly limited, and for example, conventional organic dyes used for coloring plastic materials may be used. For example, nitroso series dyes, nitro series dyes, azo series dyes, triphenylmethane series dyes, phthalic anhydride series dyes, indigo series dyes or anthroquinone series dyes, and the like may be used, and preferably, anthraquinone series dyes may be used as blue dyes. An example of dyes that can be suitably used in the present application may include MACROLEX series manufactured by Lanxess, and the like.

The application amount of the dye is not particularly limited. For example, when all of the above-described four dyes (dyes capable of absorbing light in wavelength bands representing red, green, blue, and yellow light) are applied, the content of each dye may be adjusted based on 100 parts by weight of the binder resin as follows, from the viewpoint of preventing luminance degradation or the like while effectively controlling the color of the transmittance control layer. The content of the dye capable of absorbing light in the wavelength band representing green light may be 0.05 parts by weight or more, 0.1 parts by weight or more, or 0.15 parts by weight or more, and may be 0.3 parts by weight or less, 0.25 parts by weight or less, 0.2 parts by weight or less, or 0.15 parts by weight or less. The content of the dye capable of absorbing light in the wavelength band representing yellow light may be 0.1 parts by weight or more, 0.15 parts by weight or more, 0.2 parts by weight or more, or 0.25 parts by weight or more, and may be 0.5 parts by weight or less, 0.4 parts by weight or less, 0.3 parts by weight or less, 0.25 parts by weight or less. The content of the dye capable of absorbing light in the wavelength band representing red light may be 0.05 parts by weight or more, 0.1 parts by weight or more, or 0.15 parts by weight or more, and may be 0.3 parts by weight or less, 0.25 parts by weight or less, 0.2 parts by weight or less, or 0.15 parts by weight or less. The content of the dye capable of absorbing light in the wavelength band representing blue light may be 0.01 parts by weight or more, 0.05 parts by weight or more, or 0.1 parts by weight or more, and may be 0.5 parts by weight or less, 0.4 parts by weight or less, 0.3 parts by weight or less, 0.2 parts by weight or less, or 0.1 parts by weight or less.

The method of manufacturing the transmittance control layer is also not particularly limited. For example, like the above-described pressure-sensitive adhesive layer, the transmittance control layer may also be prepared by using, specifically curing, the composition comprising the binder resin and the dye. At this time, the contents of the curing process for forming the pressure-sensitive adhesive layer may be equally applied to the description of the curing process for forming the transmittance control layer.

The composition applied to form the transmittance control layer may comprise other additional components as the additives in addition to the above-described binder resin and dye. Such additives may include crosslinking agents such as isocyanate-based compounds, silane coupling agents, catalysts, antistatic agents or antioxidants, and the like, but are not limited thereto.

The thickness of the transmittance control layer may also be appropriately adjusted so as to exhibit the aforementioned transmittance. The thickness may be, for example, in the range of 1 μm to 30 μm. In another example, the thickness may be 1.5 μm or more, 2 μm or more, 2.5 μm or more, or 3 μm or more, and may be 25 μm or less, 20 μm or less, 15 μm or less, 10 μm or less, 9 μm or less, or 8 μm or less.

The optical laminate of the present application further comprises an antireflection layer exhibiting specific optical properties, together with the pressure-sensitive adhesive layer and the transmittance control layer. The antireflection layer may literally mean a functional layer capable of preventing reflection of incident light or minimizing its reflectance.

The antireflection layer has reflectance of 2% or less for light with a wavelength in a range of 380 nm to 780 nm. That is, the antireflection layer has low reflectance for light having a visible wavelength, so that when natural light incident from the outside has been reflected, it may not be recognized by a user.

In another example, the reflectance may be 1.5% or less, 1.2% or less, 0.9% or less, 0.6% or less, 0.3% or less, or 0.2% or less, and the lower the lower limit is, it is more advantageous, and thus it is not particularly limited, but for example, it may be greater than approximately 0%, 0.01% or more, 0.05% or more, 0.1% or more, or 0.15% or more.

In the present application, the term "reflectance" may be a value obtained by converting a ratio (LR/LI) of the light quantity (LR) of reflected light to the light quantity (LI) of incident light as a percentage, which may be measured using a known spectrophotometer. In addition, the reflectance may be reflectance for light with any one wavelength in the above-described wavelength range or an average value of reflectance for light with wavelengths in the above range. Furthermore, the reflectance may be a value measured after darkening treatment on the rear surface of the antireflection layer.

The method of manufacturing the antireflection layer exhibiting the above-described reflectance is not limited. Various methods of manufacturing the antireflection layer are known. For example, the antireflection layer may be manufactured by (1) a method of laminating a plurality of films having different refractive indices and specifically setting the magnitude relationship of their refractive indices, whereby external natural light is not reflected. Also, in another example, the antireflection layer may be manufactured by (2) dispersing an appropriate amount of hollow microparticles such as hollow silica having a predetermined size in the binder resin. At this time, some irregularities may be provided on the surface of the antireflection layer, and external natural light is diffusely reflected by the irregularities, so that the aforementioned low reflection characteristics may be realized.

Meanwhile, if the antireflection layer is manufactured by applying the same method as the method (2), it is apart from the saying that it is possible to exhibit low reflection characteristics, and there is an aspect that is insufficient to represent a color suitable for a general display device. Therefore, in the present application, the antireflection layer may be manufactured by applying the same method as the method (1). Hereinafter, the antireflection layer applied in the present application will be described in more detail.

The antireflection layer may comprise at least two layers having different refractive indices. For example, the antireflection layer may comprise a hard coating layer and a lowly refractive coating layer. Here, the lowly refractive coating layer may have a refractive index lower than that of the hard coating layer.

The lowly refractive coating layer may comprise at least two regions having different refractive indices (for example, a first region and a second region). Here, the first region and the second region may be distinguished by the types or refractive indices of particles included therein, or a difference in refractive indices of the respective regions themselves.

For example, the first region and the second region may have different refractive indices for light with a wavelength in a range of 400 nm to 700 nm. Specifically, in the first region and the second region, the layer positioned on the top may have a lower refractive index. As described below, the second region is located on the first region, and thus the refractive index of the second region may be lower than the refractive index of the first region.

In one example, the first region may have a refractive index of 1.55 or more for light with a wavelength in a range of 400 nm to 700 nm. The refractive index of the second region for light with the wavelength range may be 1.45 or less.

In another example, the wavelength on the basis of the refractive indices of the first region and the second region included in the lowly refractive coating layer may be 430 nm or more, 450 nm or more, 470 nm or more, 490 nm or more, 510 nm or more, 530 nm or more, or 550 nm or more, and may be 670 nm or less, 650 nm or less, 630 nm or less, 610 nm or less, 590 nm or less, 570 nm or less, or 550 nm or less, and may also be approximately 550 nm or so.

In another example, the refractive index of the first region may be 1.60 or more, or 1.65 or more, and may be 2.5 or less, 2.3 or less, 2.1 or less, or 2.0 or less. In another example, the refractive index of the second region may be 1.0 or more, 1.15 or more, 1.2 or more, 1.25 or more, 1.3 or more, and may be 1.4 or less, 1.35 or less, or 1.3 or less.

The refractive indices of the first region and the second region may be measured by applying a commonly known method. The refractive index may be measured, for example, through ellipticity calculation of polarization measured by ellipsometry.

The three-dimensional or cross-sectional shape of each of the first and second regions is not particularly limited.

In one example, the first region and the second region may have a shape in which their respective boundaries or boundary surfaces between them are unclearly distributed.

In one example, the first region and the second region may have a shape of layers that are visually separated from each other, where each region has a predetermined thickness.

In one example, the first region and the second region do not have layers that are visually separated from each other, but may also have computational layers that are confirmed when ellipticity of polarization measured by ellipsometry has been optimized by the following equation 1.

When the first and second regions included in the lowly refractive coating layer meet specific conditions, it is possible to implement an antireflection layer having low reflectance as well as high light transmittance, scratch resistance and antifouling properties.

Specifically, when ellipticity of polarization measured by ellipsometry for each of the first and second regions has been optimized by a Cauchy model of the following equation 1, and then the first region and the second region meet specific conditions, it is possible to implement an antireflection layer having low reflectance as well as high light transmittance, scratch resistance and antifouling properties:

$$n(\lambda) = A + \frac{B}{\lambda^2} + \frac{C}{\lambda^4}$$ [Equation 1]

In Equation 1 above, n(λ) is a refractive index at a wavelength of λ, λ is in a range of 300 nm to 1800 nm, and A, B and C are each a Cauchy parameter.

The method of measuring ellipticity of polarization measured by ellipsometry and parameters (ellipsometry data, Ψ and Δ, etc.) for optimizing the same can be measured by applying a known related device. For example, the parameters can be calculated by setting an incident angle to 70 degrees and measuring linear polarization for light having a wavelength in a range of 380 nm to 1000 nm with J. A. Woollam Co.'s M-2000 device.

In another example, the wavelength of light on the basis of the linear polarization measurement may be 400 nm or more, 420 nm or more, 440 nm or more, 460 nm or more, 480 nm or more, 500 nm or more, 520 nm or more, 540 nm or more, 560 nm or more, 580 nm or more, 600 nm or more, or 620 nm or more, and may be 900 nm or less, 800 nm or less, 700 nm or less, 690 nm or less, 680 nm or less, 670 nm or less, 660 nm or less, 650 nm or less, or 640 nm or less.

The linear polarization data measured as above may be optimized to have a mean square error (MSE) of 5 or less, 4 or less, or 3 or less. The optimization may be performed with Complete EASE software.

The MSE is a value obtained by taking the average of the square of the error (residual), which is a quantitative measure of accuracy of statistical measurement, and it can be said that the smaller the value, the higher the accuracy of the measurement. The MSE can be calculated through a commonly known method or a statistical program, and the like, and for example, it can be derived as the least square of linear polarization measurement data.

When the Cauchy parameters A, B and C optimized for the first and second regions satisfy at least one of the following conditions 1 to 3, it is possible to implement an antireflection layer having low reflectance as well as high light transmittance, scratch resistance and antifouling properties. That is, when the first and second regions included in the lowly refractive coating layer satisfy any one of the following conditions 1 to 3, any two selected from the following conditions 1 to 3 or all of the following conditions 1 to 3, the antireflection layer may have low reflectance and simultaneously high light transmittance, and the like:

[Condition 1]

A difference between the A value for the first region and the A value for the second region is 0.2 or more.

[Condition 2]

The A value for the first region is in a range of 1.50 to 2.00.

[Condition 3]

The A value for the second region is in a range of 1.00 to 1.40.

Condition 1 above defines that the difference between the A value for the first region and the A value for the second region is 0.2 or more.

Condition 2 above defines that the A value for the first region is in the range of 1.50 to 2.00.

Condition 3 above defines that the A value for the second region is in the range of 1.00 to 1.40.

The Cauchy parameters A, B and C in Equation 1 above are each related to changes in refractive indices and extinction coefficients according to wavelengths. If the low refractive coating layer satisfies Conditions 1 to 3 above and the values of B and C above are within a specific range as necessary, the optimized electron density and refractive index distribution may be maintained inside the lowly refractive coating layer. As a result, an antireflection layer having a stable structure against scratches or external contaminants as well as a very low level of reflectance can be formed.

In Condition 1 above, in another example, the difference between the A value for the first region and the A value for the second region may be 0.25 or more, 0.3 or more, or 0.35 or more, and may be 0.5 or less, 0.45 or less, 0.4 or less, or 0.38 or less.

In Condition 2 above, the A value for the first region may be 1.55 or more, or 1.60 or more, and may be 1.95 or less, 1.9 or less, 1.85 or less, 1.8 or less, 1.75 or less, 1.7 or less, or 1.65 or less.

In Condition 3 above, the A value for the second region may be 1.05 or more, 1.1 or more, 1.15 or more, 1.2 or more, or 1.25 or more, and may be 1.35 or less, or 1.30 or less.

The A value is a factor related to the refractive index, particularly at the maximum wavelength. That is, the antireflection layer may maintain lower reflectance while maintaining the optimized refractive index distribution, and may also have a stable structure against scratches or external contaminants.

In one example, the B value for the first region may be in the range of 0 to 0.10. In another example, the value may be in the range of 0 to 0.05, or 0 to 0.01.

In one example, the B value for the second region may be in the range of 0 to 0.10. In another example, the value may be in the range of 0 to 0.05, or 0 to 0.01.

In one example, the C value for the first region may be in the range of 0 to 0.01. In another example, the value may be in the range of 0 to 0.005 or 0 to 0.001.

In one example, the C value for the second region may be in the range of 0 to 0.01. In another example, the value may be in the range of 0 to 0.005 or 0 to 0.001.

In one example, the first and second regions included in the lowly refractive coating layer may each comprise a binder resin and specific inorganic nanoparticles. For example, the first region may comprise a binder resin and highly refractive inorganic nanoparticles. The second region may comprise a binder resin and lowly refractive inorganic nanoparticles. The binder resins included in the first and second regions may be the same or different from each other. Here, the inorganic nanoparticles applied to the first region and the second region are defined as a relative criterion for the large and small relationship of their refractive indices, rather than an absolute criterion.

In one example, the type of each of the highly refractive inorganic nanoparticles and the lowly refractive inorganic nanoparticles is not particularly limited.

The refractive index of the highly refractive inorganic nanoparticles may be 1.5 or more, or 1.55 or more for light with a wavelength in a range of 400 nm to 700 nm.

The refractive index of the lowly refractive inorganic nanoparticles may be 1.45 or less or 1.40 or less for light with a wavelength in a range of 400 nm to 700 nm.

In another example, the reference wavelength of the refractive indices of the highly refractive and lowly refractive inorganic nanoparticles may be 430 nm or more, 450 nm or more, 470 nm or more, 490 nm or more, 510 nm or more, 530 nm or more, or 550 nm or more, and may be 670 nm or less, 650 nm or less, 630 nm or less, 610 nm or less, 590 nm or less, 570 nm or less, or 550 nm or less, and may also be approximately 550 nm or so.

The type of the highly refractive inorganic nanoparticles is not particularly limited, to which a known component may be applied. As the highly refractive inorganic nanoparticles, for example, at least one of titanium dioxide, antimony trioxide, zirconium dioxide, tin oxide, magnesium oxide, zinc oxide, barium titanate, aluminum oxide, cerium oxide, zirconium titanate, and strontium titanate may be applied.

The type of the lowly refractive inorganic nanoparticles is not particularly limited, to which a known component may be applied. As the lowly refractive inorganic nanoparticles, at least one of magnesium fluoride, hollow silica and mesoporous silica may be applied.

The ratio of the highly refractive inorganic nanoparticles and the lowly refractive inorganic nanoparticles is not particularly limited, which may be appropriately adjusted within a range that sufficiently secures scratch resistance and antifouling properties of the antireflection layer.

The ratio of the highly refractive inorganic nanoparticles may be, for example, in the range of 30 parts by weight to 600 parts by weight relative to 100 parts by weight of the binder resin. In another example, the ratio may be 50 parts by weight or more, 100 parts by weight or more, 150 parts by weight or more, 200 parts by weight or more, 250 parts by weight or more, 300 parts by weight or more, 350 parts by weight or more, 400 parts by weight or more, 450 parts by weight or more, 500 parts by weight or more, or 550 parts by weight or more, and may be 595 parts by weight or less, 590 parts by weight or less, 585 parts by weight or less, 580 parts by weight or less, or 575 parts by weight or less.

The ratio of the lowly refractive inorganic nanoparticles may be, for example, in the range of 30 parts by weight to 600 parts by weight relative to 100 parts by weight of the binder resin. In another example, the ratio may be 40 parts by weight or more, 50 parts by weight or more, 60 parts by weight or more, 70 parts by weight or more, 80 parts by weight or more, 90 parts by weight or more, 100 parts by weight or more, 110 parts by weight or more, 120 parts by weight or more, 130 parts by weight or more, 140 parts by weight or more, 150 parts by weight or more, 160 parts by weight or more, 170 parts by weight or more, 180 parts by weight or more, or 190 parts by weight or more, and may be 500 parts by weight or less, 400 parts by weight or less, 300 parts by weight or less, 290 parts by weight or less, 280 parts by weight or less, 270 parts by weight or less, 260 parts by weight or less, 250 parts by weight or less, 240 parts by weight or less, 230 parts by weight or less, 220 parts by weight or less, 210 parts by weight or less, or 200 parts by weight or less.

From the viewpoint of securing the low reflectance of the antireflection layer and improving scratch resistance and antifouling properties, the ratio (HR/LR) of the average particle diameter (HR) of the highly refractive inorganic nanoparticles to the average particle diameter (LR) of the lowly refractive inorganic nanoparticles may also be properly adjusted. For example, the ratio may be in a range of 0.008 to 0.55. In another example, the ratio may be 0.01 or more, 0.02 or more, 0.03 or more, 0.04 or more, or 0.05 or more, and may be 0.54 or less, 0.53 or less, 0.52 or less, 0.51 or less, or 0.5 or less. Within the range of the particle diameter ratio, the particles may exhibit different localization and distribution aspects. For example, within the particle diameter ratio range, positions where the highly refractive inorganic nanoparticles and the lowly refractive inorganic nanoparticles are mainly distributed may be at different distances based on the interface between the hard coating layer and the lowly refractive coating layer.

In one example, the average particle diameter of each of the highly refractive and lowly refractive inorganic nanoparticles may be an average value obtained by measuring the shortest or longest particle diameter identified through electron micrographs or the like of the antireflection layer. In another example, the average particle diameter of each of the particles may mean, for example, a D50 particle diameter.

For example, the average particle diameter of the highly refractive inorganic nanoparticles may be in a range of 1 nm to 66 nm. In another example, the average particle diameter may be 5 nm or more, 10 nm or more, or 15 nm or more, and may be 60 nm or less, 55 nm or less, 50 nm or less, 45 nm or less, 40 nm or less, 35 nm or less, 30 nm or less, 25 nm or less, or 20 nm or less.

In one example, the average particle diameter of the lowly refractive inorganic nanoparticles may be in a range of, for example, 10 nm to 120 nm. In another example, the average particle diameter may be 20 nm or more, 30 nm or more, 40 nm or more, or 50 nm or more, and may be 110 nm or less, 100 nm or less, 90 nm or less, 80 nm or less, 70 nm or less, or 60 nm or less.

In one example, the arrangement of the first region and the second region may be freely adjusted. For example, the first region may be located closer to the hard coating layer than the second region. As described above, the second region may be located on the opposite side of the hard coating layer based on the first region. According to such an arrangement aspect, two or more regions or layers having different refractive indices may be formed in the lowly refractive coating layer. As a result, the light reflected at the interface between the respective layers constituting the antireflection layer may be effectively destructively interfered, whereby the reflectance of the antireflection layer may be reduced.

Meanwhile, as described above, in the lowly refractive coating layer, the first region and the second region may be layers that are distinguished from each other. Also, in terms of implementing the lower reflectance, the first region and the second region exist in a continuous phase, but may also be divided into two regions according to the type of particles included in each region. That is, in another aspect, the lowly refractive coating layer may be a single layer in which the first region and the second region are present in one layer. Such a single layer is applied in a distinct sense from a multilayer film in a form formed by laminating a plurality of films having different compositions and/or structures.

In another example, each of the first and second regions may be visually identified within the lowly refractive coating layer. For example, it can be visually confirmed by using an electron microscope or the like that in the lowly refractive coating layer, the first region and the second region each exist as a single layer or as a multilayer structure.

Because each of the first region and the second region can share common optical characteristics in the relevant region, they can be defined as one region. Specifically, when the ellipticity of the polarization measured by the ellipsometry has been optimized by the Cauchy model of Equation 1 above, each of the first region and the second region has specific Cauchy parameters A, B and C, so that they can be divided into the first region and the second region. In addition, the thickness of each region may be derived using the ellipticity of the polarization, so that in the lowly refractive coating layer, each of the first and second regions may also be defined as a predetermined layer.

In each of the first region and the second region, the Cauchy parameters A, B and C of Equation 1 may be average values within the region. Accordingly, if there is an interface between the first region and the second region, there may also be regions where the respective values of the Cauchy parameters A, B and C of each region overlap. However, even when the interface exists in this way, the thickness and/or position of each of the first and second regions may be specified according to the region that satisfies the average values of the Cauchy parameters of each of the first region and the second region.

The method of forming each of the first and second regions is not particularly limited. For example, with respect to a coating composition comprising the binder resin, highly refractive inorganic nanoparticles and/or lowly refractive inorganic nanoparticles as described above, the first and second regions may be formed by a method of coating the composition or a method of drying the same, or by adjusting the drying temperature or the like.

Generally, the lowly refractive coating layer comprising the first and second regions may be formed by a method of bar-coating the above-described coating composition and drying the coated composition layer with a hot-air drying method.

From the viewpoint of securing appropriate reflectance, when the first and second regions each appear in the form of layers, the thickness ratio between the layers may also be appropriately adjusted.

The ratio (T1/T2) of the thickness (T1) of the first region to the thickness (T2) of the second region may be in a range of 0.25 to 4. In another example, the ratio may be 0.3 or more, or 0.4 or more, and may be 3 or less, or 2.5 or less.

The thickness of the first region may be in a range of 20 nm to 300 nm. In another example, the thickness may be 50 nm or more, or 60 nm or more, and may be 270 nm or less, or 250 nm or less.

The thickness of the second region may be in a range of 70 nm to 400 nm. In another example, the thickness may be 80 nm or more, or 90 nm or more, and may be 300 nm or less, or 200 nm or less.

The thickness of each of the first and second regions may also be confirmed by optimizing the ellipticity of the polarization measured by the ellipsometry with the Cauchy model of Equation 1 above.

Therefore, the thickness of the lowly refractive coating layer may be in the range of 90 nm to 700 nm.

The type of the binder resin included in the lowly refractive coating layer is not particularly limited. For example, as the binder resin, at least one of (1) a polymer of a photo-polymerizable compound and (2) a crosslinked polymer between fluorine-containing compounds comprising a photoreactive functional group may be applied.

The photopolymerizable compound may be a monomer having a (meth)acrylate group or a vinyl group, or an oligomer thereof. Specifically, the photopolymerizable compound may be a monomer comprising 1 or more, 2 or more, or 3 or more (meth)acrylate groups or vinyl groups, or such an oligomer.

A specific example of the monomer or oligomer comprising (meth)acrylate groups may include pentaerythritol tri (meth)acrylate, pentaerythritol tetra(meth)acrylate, dipentaerythritol penta(meth)acrylate, dipentaerythritol hexa (meth)acrylate, tripentaerythritol hepta(meth)acrylate, trilene diisocyanate, xylene diisocyanate, hexamethylene diisocyanate, trimethylolpropane tri(meth)acrylate, trimethylolpropane polyethoxytri(meth)acrylate, trimethylolpropane trimethacrylate, ethylene glycol dimethacrylate, butanediol dimethacrylate, hexaethyl methacrylate, butyl methacrylate, or a mixture of two or more thereof, or a urethane modified acrylate oligomer, an epoxide acrylate oligomer, an ether acrylate oligomer, a dendritic acrylate oligomer, or a mixture of two or more thereof.

At this time, the molecular weight (number average or weight average, unit g/mol) of the oligomer is, preferably, 1,000 to 10,000.

An example of the monomer or oligomer comprising vinyl groups may include divinylbenzene, styrene, or para-methylstyrene, and the like.

The photopolymerizable compound may further comprise a fluorine-based (meth)acrylate monomer or oligomer in addition to the monomer or oligomer. When the photopolymerizable compound further comprises the fluorine-based (meth)acrylate monomer or oligomer, the ratio of the fluorine-based (meth)acrylate monomer or oligomer to the monomer or oligomer comprising the (meth)acrylate or vinyl group may be in a range of 0.1 wt % to 10 wt %.

In addition, as described above, a crosslinked polymer between fluorine-containing compounds comprising photoreactive functional groups can be applied as the binder resin applied to the lowly refractive coating layer, so that in the lowly refractive coating layer, parts derived from the fluorine-containing compounds comprising photoreactive functional groups may also be included.

Specifically, one or more photoreactive functional groups may be included in, substituted to or bonded to the fluorine-containing (having or comprising fluorine) compound comprising photoreactive functional groups. The photoreactive functional group may mean a functional group capable of participating in the polymerization reaction by irradiation of light, for example, irradiation of visible light or ultraviolet light. An example of the photoreactive functional group may include (meth)acrylate, epoxide, vinyl or thiol, and the like.

In one example, from the viewpoint of appropriately securing antifouling properties, and scratch resistance or crosslinking density, and the like of the lowly refractive coating layer, the weight average molecular weight of the fluorine-containing compound comprising photoreactive functional groups may also be appropriately adjusted. For example, the weight average molecular weight of the fluorine-containing compound comprising photoreactive functional groups may be in a range of 2,000 to 200,000. In another example, the molecular weight may be 5,000 or more, and may be 100,000 or less. In the present application, the weight average molecular weight is a converted value of standard polystyrene measured by GPC (gel permeation chromatograph).

Specifically, the fluorine-containing compound comprising photoreactive functional groups may include i) an aliphatic compound in which one or more photoreactive functional groups are substituted and one or more fluorines are substituted on at least one carbon, or such an alicyclic compound; ii) a hetero aliphatic compound in which one or more photoreactive functional groups are substituted, one or more hydrogens are substituted with fluorine and one or more carbons are substituted with silicon or oxygen, or such a hetero alicyclic compound; iii) a polydialkylsiloxane-based polymer (for example, polydimethylsiloxane-based polymer) in which one or more photoreactive functional groups are substituted and one or more fluorines are substituted on at least one silicon; iv) a polyether compound in which one or more photoreactive functional groups are substituted and at least one hydrogen is substituted with fluorine, or a mixture of two or more of i) to iv) above, or a copolymer thereof.

The content of the fluorine-containing compound comprising photoreactive functional groups is not particularly limited, which may be appropriately adjusted within a range to ensure durability or scratch resistance, and the like of the lowly refractive coating layer. For example, the content of the fluorine-containing compound comprising photoreactive functional groups may be in the range of 20 parts by weight to 300 parts by weight relative to 100 parts by weight of the photopolymerizable compound.

From the viewpoint of securing compatibility with other components included in the lowly refractive coating layer and preventing haze occurrence of the final product, the fluorine-containing compound comprising photoreactive functional groups may also further comprise silicon or a silicon-based compound. That is, the fluorine-containing compound comprising photoreactive functional groups may selectively comprise silicon or a silicon-based compound therein. At this time, the silicon or silicon-based compound may be included in a content within a range of 0.1% to 20% based on the weight of the fluorine-containing compound comprising photoreactive functional groups.

The manufacturing method or type, and the like of the hard coating layer is not particularly limited. For example, the hard coating layer may comprise a photocurable resin, and organic fine particles and/or inorganic fine particles. That is, the hard coating layer may comprise a photocurable resin and organic fine particles, comprise a photocurable resin and inorganic fine particles, or comprise a photocurable resin, organic fine particles and inorganic fine particles. More specifically, the organic fine particles and/or the inorganic fine particles may be present in a form dispersed in the photocurable resin.

The photocurable resin included in the hard coating layer is a polymer of a photocurable compound capable of causing a polymerization reaction when irradiated with light such as ultraviolet light, where conventional ones in the art may be applied.

Specifically, the photocurable resin may be one or more selected from the reactive acrylate oligomer group consisting of urethane acrylate oligomers, epoxide acrylate oligomers, polyester acrylate and polyether acrylate; and the group consisting of dipentaerythritol hexaacrylate, dipentaerythritol hydroxy pentaacrylate, pentaerythritol tetraacrylate, pentaerythritol triacrylate, trimethylene propyl triacrylate, propoxylated glycerol triacrylate, trimethylpropane ethoxy triacrylate, 1,6-hexanediol diacrylate, propoxylated glycerol triacrylate, tripropylene glycol diacrylate, and ethylene glycol diacrylate.

The particle diameter of the organic fine particles may be in a range of, for example, 1 μm to 10 μm. The particle diameter of the inorganic fine particles may be in a range of, for example, 1 nm to 500 nm or 1 nm to 300 nm. The particle diameter of the organic fine particles or inorganic fine particles may be defined as a volume average particle diameter.

As the organic fine particles, at least one of an acrylic resin, a styrene resin, an epoxide resin and a nylon resin may be applied.

As the inorganic fine particles, at least one of silicon oxide, titanium dioxide, indium oxide, tin oxide, zirconium oxide and zinc oxide may be applied.

The photocurable resin applied to the hard coating layer may further comprise a polymer having a weight average molecular weight of 1,000 or more (also referred to as a high molecular weight polymer). As the high molecular weight polymer, at least one of a cellulose polymer, an acrylic polymer, a styrene polymer, an epoxide polymer, a nylon polymer, a urethane polymer and an olefin polymer may be applied.

In another example, as the hard coating layer, a hard coating layer comprising a photocurable binder resin and an antistatic agent dispersed in the photocurable binder resin may also be applied.

As the photocurable binder resin blended with an antistatic agent and applied to form the hard coating layer, for example, a polyfunctional (meth)acrylate-based monomer or oligomer may be applied. At this time, the number of (meth)acrylate functional groups may be in a range of 2 to 10, 2 to 8 or 2 to 7 in terms of securing the physical properties of the hard coating layer.

As such a polyfunctional (meth)acrylate-based monomer or oligomer, at least one monomer or oligomer of pentaerythritol tri(meth)acrylate, pentaerythritol tetra(meth)acrylate, dipentaerythritol penta(meth)acrylate, dipentaerythritol hexa(meth)acrylate, dipentaerythritol hepta(meth)acrylate, tripentaerythritol hepta(meth)acrylate, trilene diisocyanate, xylene diisocyanate, hexamethylene diisocyanate, trimethylolpropane tri(meth)acrylate, and trimethylolpropane polyethoxytri(meth)acrylate may be applied.

The antistatic agent may be a quaternary ammonium salt compound; a pyridinium salt; a cationic compound having 1 to 3 amino groups; an anionic compound such as a sulfonic acid base, a sulfuric acid ester base, a phosphoric acid ester base and a phosphonic acid base; a cationic compound such as an amino acid-based or amino sulfuric acid ester-based compound; a nonionic compound such as an imino alcohol-based compound, a glycerin-based compound and a polyethylene glycol compound; an organometallic compound such as a metal alkoxide compound comprising tin or titanium, and the like; a metal chelate compound such as an acetylacetonate salt of the organometallic compound; a reactant or polymer of two or more of these compounds; or a mixture of two or more of these compounds. Here, the quaternary ammonium salt compound may be a compound having one or more quaternary ammonium salt groups in the molecule, where a low molecular weight compound or a high molecular weight compound may be used as the quaternary ammonium salt compound without limitation.

In addition, a mixture of a conductive polymer and metal oxide fine particles may be used as the antistatic agent.

As the conductive polymer, aromatic conjugated poly (para-phenylene), heterocyclic conjugated polypyrrole, polythiophene, aliphatic conjugated polyacetylene, hetero atom-containing conjugated polyaniline, and mixed conjugated poly(phenylene vinylene), a conjugated double chain type compound having a plurality of conjugated chains in the molecule, and a conductive composite obtained by graft- or block-copolymerizing conjugated polymer chains onto a saturated polymer, and the like may be used.

The metal oxide fine particles may include zinc oxide, antimony oxide, tin oxide, cerium oxide, indium tin oxide, indium oxide, aluminum oxide, antimony-doped tin oxide, aluminum-doped zinc oxide, and the like.

As described above, when the hard coating layer comprises a photocurable binder resin and an antistatic agent, the hard coating layer may also further comprise at least one compound of an alkoxysilane-based oligomer and a metal alkoxide-based oligomer.

As the alkoxy silane-based compound, at least one of those that are common in the art, for example, tetramethoxysilane, tetraethoxysilane, tetraisopropoxysilane, methyltrimethoxysilane, methyltriethoxysilane, methacryloxypropyl trimethoxysilane, glycidoxypropyl trimethoxysilane and glycidoxypropyl triethoxysilane may be applied.

The metal alkoxide-based oligomer may be prepared through a sol-gel reaction of a composition comprising a metal alkoxide-based compound and water. The sol-gel reaction may be performed in a method based on the method for preparing the alkoxysilane oligomer as described above. However, since the metal alkoxide-based compound can react rapidly with water, the sol-gel reaction can be performed by a method of diluting the metal alkoxide-based compound in an organic solvent and then slowly dropping water. At this time, in consideration of reaction efficiency and the like, the molar ratio (based on metal ions) of the metal alkoxide compound to water is preferably adjusted within the range of 3 to 170.

As the metal alkoxide-based compound, at least one of titanium tetra-isopropoxide, zirconium isopropoxide and aluminum isopropoxide may be applied.

The thickness of the hard coating layer may be appropriately adjusted within the range of implementing the function of the antireflection layer. The thickness of the hard coating layer may be in the range of 0.1 μm to 100 μm.

The method of forming a hard coating layer is not particularly limited. For example, the hard coating layer may be prepared through a process of applying a composition comprising the above-described binder resin and other components (fine particles or antistatic agent, etc.) on a base material and curing it (for example, photocuring by irradiation of light).

The method of forming an antireflection layer is not particularly limited. For example, a method of sequentially coating the composition for forming the hard coating layer and the composition for forming the lowly refractive coating layer and then simultaneously curing them, or curing each of the compositions to form each layer and then laminating them may be applied. In terms of securing appropriate reflectance and the like, it may also be appropriate to apply the latter method.

Since the thickness of the antireflection layer may also affect the reflectance, it can be appropriately adjusted. For example, the thickness of the antireflection layer may be in the range of 1 μm to 10 μm, while satisfying the above-described thickness conditions of the lowly refractive coating layer and the hard coating layer. In another example, the thickness may be 1.5 μm or more, 2 μm or more, 2.5 μm or more, or 3 μm or more, and may be 9.5 μm or less, 9 μm or less, 8.5 μm or less, 8 μm or less, 7.5 μm or less, or 7 μm or less. The thickness of the antireflection layer may mean the total thickness of the hard coating layer and the lowly refractive coating layer as described above.

The optical laminate of the present application may comprise the pressure-sensitive adhesive layer, the transmittance control layer and the antireflection layer in this order. Specifically, in the optical laminate, the antireflection layer may be present on the transmittance control layer, and the transmittance control layer may be present on the pressure-sensitive adhesive layer. When the layers have been arranged in this way and the optical laminate of the present application has been applied to an OLED display device, it is possible to further improve the display quality of the device while solving the problem of visibility degradation due to reflection of external incident natural light. Specifically, by the combination of the transmittance control layer and the antireflection layer in the optical laminate of the present application, the problem of visibility degradation due to reflection of external incident natural light can be solved, and furthermore, by the additional combination of the pressure-sensitive adhesive layer satisfying the above-described characteristics, the deterioration of display quality caused by diffraction of the reflected light or light emitted from the display device can be improved.

In addition to the above-described pressure-sensitive adhesive layer, transmittance control layer and antireflection layer, the optical laminate may further comprise a known member. For example, the optical laminate may further comprise a known protective film or a release film to protect it from external impact or contamination. Subsequently, in the process of manufacturing a display device by applying the optical laminate, the protective film and the release film, and the like may also be removed.

The present application also relates to a display device.

The display device of the present application comprises the optical laminate. In addition, the display device of the present application comprises a light emitting panel. Since the optical laminate of the present application is particularly suitable for an OLED display device, an organic light emitting panel is preferably used as the light emitting panel.

In the display device of the present application, the optical laminate is attached to the organic light emitting panel via the pressure-sensitive adhesive layer of the optical laminate. Specifically, the optical laminate may be attached to the side of the organic light emitting panel, from which light is emitted, via the pressure-sensitive adhesive layer. More specifically, the optical laminate may be directly attached to the side of the organic light emitting panel, from which light is emitted, via the pressure-sensitive adhesive layer. The direct attachment means that there is no separate element between the organic light emitting panel and the pressure-sensitive adhesive layer.

The display device of the present application comprises the optical laminate, so that the problem of visibility degradation due to reflection of external natural light can be solved and the display quality can also be improved.

As described above, through the application of the optical laminate, the display device of the present application can solve the problem of visibility degradation due to reflection of external natural light without applying any polarizing plate (a retardation plate, etc.). That is, the display device of the present application may comprise no retardation plate. Here, the retardation plate may mean a known optical member capable of changing the polarization direction of incident light, as is known.

That is, the display device of the present application may satisfy inherent optical properties that cannot be exhibited when an element such as a polarizing plate has been applied. Specifically, the display device of the present application may have a specific color value. More specifically, in the display device of the present application, a value of a specific coordinate of reflective color coordinates may be within a predetermined range.

In the present application, the reflective color coordinates of any member may mean a color coordinate system that displays the color of light absorbed by the member based on brightness and chromaticity. The L* axis, which is described below, may mean the axis of the brightness element, the a* axis may be an axis of two colors of red and green, and the b* axis may mean an axis of two colors of blue and yellow. The color value can be measured in the manner explained in examples to be described below.

The display device may have an a* value of the reflective color coordinate system in a range of −2 to 2. In another example, the a* value may be −1.5 or more, −1 or more, −0.5 or more, −0.3 or more, or −0.1 or more, and may be 1.5 or less, 1 or less, 0.5 or less, 0.3 or less, or 0.1 or less.

The display device may have a b* value of the reflective color coordinate system in a range of −2 to 2. In another example, the b* value may be −1.5 or more, −1 or more, −0.5 or more, −0.3 or more, or −0.1 or more, and may be 1.5 or less, 1 or less, 0.5 or less, 0.3 or less, or 0.1 or less. Such color values are optical properties that cannot be achieved by conventional methods such as circularly polarizing plates.

In another example, the display device may have an L* value of the reflective color coordinate system in a range of 55 to 75. In another example, the L* value may be 57 or more, 59 or more, 61 or more, 63 or more, or 65 or more, and may be 69 or less, 67 or less, or 65 or less.

Each value in the reflective color coordinate system can be measured by applying a general method of measuring each coordinate of the color coordinate system, and for example, after placing the equipment (for example, spectrophotometer) having an integrating sphere-shaped detector at the measurement position, it can be measured according to the manufacturer's manual.

The structure of the organic light emitting panel is known. For example, the organic light emitting panel may comprise a substrate; and a first electrode layer; an organic light emitting layer; and a second electrode layer as sequentially provided on the first surface of the substrate. Here, the optical laminate may be positioned on the side from which light is emitted from the organic light emitting panel, and specifically, may be directly positioned on the side from which light is emitted from the organic light emitting panel.

For example, as is described below, when the display device has a bottom emission structure in which light is emitted toward a substrate, the optical laminate may be disposed outside the substrate. In addition, when the display device has a top emission structure that light is emitted toward an encapsulation substrate to be described below, the optical laminate may be disposed outside the encapsulation substrate. The optical laminate may improve visibility of the display device by preventing external light from being reflected by a reflective layer made of metal, such as electrodes and wirings of the display device, and coming out of the display device.

A plastic substrate may be used as the substrate. A display device comprising the plastic substrate may be advantageous in implementing a rollable, flexible or bendable display device.

The plastic substrate may comprise a polymer. The polymer may be exemplified by polyimide, polyamic acid, polyethylene naphthalate, polyether ether ketone, polycarbonate, polyethylene terephthalate, polyether sulfide, polysulfone or an acrylic polymer, and the like. In one example, in terms of process temperatures, the plastic substrate may comprise polyimide with excellent high-temperature durability.

As the substrate, a translucent substrate can be used. The translucent substrate may have, for example, transmittance of 50% or more, 60% or more, 70% or more, or 80% for light in the visible light region.

One of the first electrode layer and the second electrode layer may be an anode and the other may be a cathode. The anode is an electrode to which holes are injected, which may be made of a conductive material having a high work function, and the cathode is an electrode to which electrons are injected, which may be made of a conductive material having a low work function. In one example, the first electrode layer may be an anode and the second electrode layer may be a cathode. In one example, the anode may be a transparent electrode, and the cathode may be a reflective electrode. The anode may comprise a transparent metal oxide, for example, ITO, IZO, AZO, GZO, ATO or $SnO_2$, and the like. The cathode may comprise a metal, for example, Ag, Au, Al or the like.

The organic light emitting layer may comprise an organic material capable of emitting light when power has been applied to the first electrode layer and the second electrode layer. In a structure referred to as a so-called bottom emitting device, the first electrode layer may be formed of a transparent electrode layer, and the second electrode layer may be formed of a reflective electrode layer. Also, in a structure referred to as a so-called top emitting device, the first electrode layer is formed of a reflective electrode layer, and the second electrode layer is formed of a transparent electrode layer. Electrons and holes injected by the electrode layers may be recombined in the organic light emitting layer to generate light. The light can be emitted toward the substrate in the bottom emitting device and toward the second electrode layer in the top emitting device.

The organic emitting layer may comprise a red emitting layer, a green emitting layer and a blue emitting layer. The emitting layers may comprise known organic materials that emit red, green and blue, respectively. In one example, the display device may be driven by a method (RGB method) that three primary color light emitting layers form one pixel (dot, picture element) while emitting different colors, respectively, or may be driven by a method (WOLED method) that one pixel is formed by laminating the three primary color light emitting layers so as to emit white and then various colors are implemented by disposing a color filter layer on the top of the white light emitting layer.

The organic light emitting panel may further comprise sub-layers between the first electrode layer and the organic light emitting layer and between the second electrode layer and the organic light emitting layer. The sub-layer may include a hole transporting layer, a hole injecting layer, an electron injecting layer, and an electron transporting layer for balancing electrons and holes, but is not limited thereto.

The organic light emitting display panel may further comprise an encapsulation substrate. The encapsulation substrate may be present on the second electrode layer. The encapsulation substrate may be made of glass, a metal and/or a polymer, and may encapsulate the first electrode layer, the organic light emitting layer and the second electrode layer to prevent moisture and/or oxygen from being introduced from the outside.

Advantageous Effects

When the optical laminate of the present application has been applied to an OLED display device, the problem of visibility due to reflection of external incident natural light of the device can be solved, and simultaneously its display quality can also be improved.

DESCRIPTION OF DRAWINGS

FIG. 1 is a photograph of a surface on a viewer side surface of a display device in Comparative Example.

FIG. 2 is a photograph of a surface on a viewer side surface of a display device in Example.

DETAILED DESCRIPTION

Hereinafter, the present application will be described in detail through examples, but the scope of the present application is not limited to the following examples.

1. Haze

The haze of the pressure-sensitive adhesive layer was measured based on the measurement standard of JIS K7105 using Murakami Color Research Laboratory's HM-150 equipment.

2. Transmittance

The transmittance of the transmittance control layer was measured using a spectrophotometer (Jasco, V-7100) according to the manufacturer's manual. The transmittance of the transmittance control layer is average transmittance for light with a wavelength in the range of 380 nm to 780 nm as measured by the above equipment.

3. Reflectance

The reflectance of the antireflection layer was calculated as the average of the reflectance measured in the wavelength region within the range of 380 nm to 780 nm using the reflectance mode of Solidspec 3700 (Shimadzu) equipment after darkening the back side of the layer.

4. Refractive Index

The refractive index of the pressure-sensitive adhesive layer, acrylic copolymer, etc. was calculated as the value obtained by measuring Ψ and Δ values at wavelengths in the range of 245 nm to 1700 nm using an ellipsometer (J. A. Woollam's V-Vase) and then reading the numerical value at the wavelength of 632.8 nm.

5. Color Coordinates

The reflective color coordinate of the display device was measured using Jasco's V-7100 equipment based on the manual of the corresponding equipment.

6. Ellipsometry

With respect to the antireflection layer, the ellipticity of the polarization was measured by the ellipsometry. Measurement conditions are as follows.

Equipment: M-2000 (J. A. Woollam)
Incident angle: 70 degrees
Wavelength range: 380 nm to 1000 nm
Measurement light: linearly polarized light
Analysis software of linear polarization measurement data: Complete EASE
Mean square error of Cauchy model: 3 or less The refractive index of each of the first and second regions in the antireflection layer was described as the refractive index for light with a wavelength of 550 nm using the ellipsometry.

EXAMPLE

Optical Laminate and Display Device

Pressure-Sensitive Adhesive Composition and Pressure-Sensitive Adhesive Layer

A pressure-sensitive adhesive composition was prepared by blending the following components in the following contents based on 100 parts by weight of the solid content of a pressure-sensitive adhesive resin (LC-6BB, containing n-butyl acrylate in a content of about 94 wt % and acrylic acid in a content of about 6 wt %, and having a refractive index of about 1.46 for light with a wavelength of 632.8 nm):

Light scattering particles (Tospearl 145, Momentive Performance, refractive index for light with a wavelength of 632.8 nm: about 1.43, D50 particle diameter: about 4.5 μm) 10 parts by weight Toluene isocyanate-based crosslinking agent (T-706B, Soken) 0.93 parts by weight Epoxy-based crosslinking agent (T-743L, Soken) 0.005 parts by weight Silane coupling agent (T-789J, Soken) 0.1 parts by weight The pressure-sensitive adhesive composition was coated on the release-treated side of a release-treated PET (polyethylene terephthalate) film (MRF-38, Mitsubishi Chemical) with a thickness of 38 μm to have a thickness of about 10 μm after drying, and thermally cured at a temperature of 80° C. for about 3 minutes to prepare a pressure-sensitive adhesive layer having haze of about 45% and a refractive index of about 1.465 for light with a wavelength of 632.8 nm.

Composition for Forming Transmittance Control Layer and Transmittance Control Layer A composition for forming a transmittance control layer was prepared by blending the following components in the following contents based on 100 parts by weight of the solid content of a binder resin (acrylic resin, AD-701, LG Chem):

Xylene isocyanate-based crosslinking agent (T-39M, Soken) 0.083 parts by weight

Silane coupling agent (T-789J, Soken) 0.223 parts by weight

Catalyst (di-n-butyl tin dilaurate-based catalyst diluted in ethyl acetate at a concentration of 0.5 wt %, C-700, Hannong Chemicals Inc.) 0.0065 parts by weight Antistatic agent (FC-4400, 3M) 1 part by weight Antioxidant (Kinox 80, High Polymer Labs) 0.5 parts by weight Green area absorbing dye 0.18 parts by weight, yellow area absorbing dye 0.25 parts by weight, red area absorbing dye 0.15 parts by weight and blue area absorbing dye 0.1 parts by weight The composition for forming a transmittance control layer was coated to have a thickness of about 15 μm and thermally cured, and then a transmittance control layer having transmittance of about 60% for light with a wavelength of 632.8 nm and a thickness of about 5 μm was prepared.

Antireflection Layer

Hard Coating Layer

A salt type antistatic hard coating solution (LJD-1000, KYOEISHA) having a solid content of approximately 50 wt % was coated on a triacetyl cellulose film with a #10 Mayer bar. Then, the film was dried at a temperature of about 90° C. for about 1 minute or so, and then irradiated with UV rays of 150 mJ/cm$^2$ to prepare a hard coating layer having a thickness of about 5 μm.

Lowly Refractive Coating Layer

A composition for forming a lowly refractive coating layer was prepared by diluting 190 parts by weight of hollow silica nanoparticles (JSC catalyst and chemicals) having a diameter of approximately 50 to 60 nm or so, 572 parts by weight of zirconium oxide particles having a diameter of approximately 16 nm or so, 73 parts by weight of a fluorine-containing compound (RS-923, DIC) and 16.2 parts by weight of a photopolymerization initiator (Irgacure 127, CIBA), relative to 100 parts by weight of pentaerythritol triacrylate (PETA), in methyl isobutyl ketone (MIBK) to have a solid content concentration of about 3 wt %.

The composition was coated on the hard coating layer with a #5 Mayer bar to have a thickness of about 250 nm. Then, the layer was dried at a temperature of 40° C. for about 2 minutes, and then irradiated with ultraviolet rays of about 252 mJ/cm$^2$ and cured, thereby forming an antireflection layer comprising the lowly refractive coating layer formed on the hard coating layer.

The antireflection layer had average reflectance of about 0.18%, and it could be confirmed that a first region having a refractive index of about 1.65 for light with a wavelength of 550 nm and a second region having a refractive index of about 1.30 for light with a wavelength of 550 nm were formed on the antireflection layer. Then, the results of confirming the Cauchy parameters of the antireflection layer according to the ellipsometry are as shown in Table 1 below.

TABLE 1

| First region | | | Second region | | | Difference in |
|---|---|---|---|---|---|---|
| A | B | C | A | B | C | A values |
| 1.626 | 0.000 | 0.00023579 | 1.252 | 0.00221 | 0.0059387 | 0.374 |

The transmittance control layer was laminated on the pressure-sensitive adhesive layer, and the antireflection layer was laminated on the transmittance control layer to prepare an optical laminate that the pressure-sensitive adhesive layer, the transmittance control layer and the antireflection layer existed in this order.

A display device was manufactured by attaching the optical laminate to a viewer side surface of a known organic light emitting panel (reflectance for a wavelength of 632.8 nm about 20%) via the pressure-sensitive adhesive layer.

As a result of measuring the reflective color values of the display device in Example, the L* value was 65, the a* value was 2.96, and the b* value was −0.46.

COMPARATIVE EXAMPLE

Manufacturing of Optical Laminate and Display Device

An optical laminate was prepared in the same manner as in Example except that the pressure-sensitive adhesive layer was not prepared, and a display device was manufactured by laminating the transmittance control layer of the optical laminate on a viewer side surface of a known organic light emitting panel (reflectance for a wavelength of 632.8 nm about 20%).

As a result of measuring the reflective color values of the display device in Comparative Example, the L* value was 65, the a* value was 4.38, and the b* value was −0.06.

Evaluation

A photograph of the viewer side surface of the display device in Comparative Example was shown in FIG. 1, and a photograph of the viewer side surface of the display device in Example was shown in FIG. 2. According to the drawings, it is apart from the saying that the display device of Comparative Example manufactured in a different manner from the present application has solved the visibility problem, and it can be confirmed that the light emitted from the organic light emitting panel is diffracted on the viewer side surface, thereby causing poor display quality.

However, in the display device to which the optical laminate having the structure defined in the present application is applied, it can be confirmed that the visibility problem is also solved, and the light emitted from the organic light emitting panel is not diffracted, whereby the display quality is also good.

The invention claimed is:

1. An optical laminate which is not a polarizing plate, comprising:
   a pressure-sensitive adhesive layer including a pressure-sensitive adhesive resin and light scattering particles having a refractive index different from that of the pressure-sensitive adhesive resin, wherein a haze of the pressure-sensitive adhesive layer as measured according to the standard of JIS K7105 is 40% or more;
   a transmittance control layer having a transmittance of 10% to 80% for light with a wavelength in a range of 380 nm to 780 nm; and
   an antireflection layer having a reflectance of 2% or less for light with a wavelength in a range of 380 nm to 780 nm,
   wherein the transmittance control layer is laminated on the pressure-sensitive adhesive layer, and the antireflection layer is laminated on the transmittance control layer, and
   wherein the transmittance control layer comprises a binder resin, a green light absorbing dye, a yellow light absorbing dye, a red light absorbing dye and a blue light absorbing dye.

2. The optical laminate according to claim 1, wherein the pressure-sensitive adhesive resin has a refractive index greater than that of the light scattering particles.

3. The optical laminate according to claim 1, wherein the light scattering particles are acrylic resin particles, styrene resin particles, styrene-acrylic copolymer particles, polyethylene particles, urethane resin particles, melamine resin particles, benzoguanamine resin particles, epoxy resin particles, silicone resin particles, silica particles, titanium oxide particles, magnesium fluoride particles, zirconium oxide particles, aluminum oxide particles or glass particles.

4. The optical laminate according to claim 1, wherein the light scattering particles have an average particle diameter (D50) in a range of 1 μm to 20 μm.

5. The optical laminate according to claim 1, wherein the pressure-sensitive adhesive layer comprises the light scattering particles in a ratio ranging from 1 part by weight to 30 parts by weight relative to 100 parts by weight of the pressure-sensitive adhesive resin.

6. The optical laminate according to claim 1, wherein the pressure-sensitive adhesive layer is located on an opposite side of the antireflection layer based on the transmittance control layer.

7. The optical laminate according to claim 1, wherein the antireflection layer comprises a hard coating layer and a lowly refractive coating layer having a refractive index lower than that of the hard coating layer.

8. The optical laminate according to claim 7, wherein the lowly refractive coating layer comprises a first region having a refractive index of 1.55 or more for light with a wavelength in a range of 400 nm to 700 nm and a second region having a refractive index of 1.45 or less for light with a wavelength in a range of 400 nm to 700 nm, and the second region is located on an opposite side of the hard coating layer based on the first region.

9. The optical laminate according to claim 8, wherein when ellipticity of polarization measured by ellipsometry for each of the first region and the second region in the lowly refractive coating layer has been optimized using a Cauchy model of following equation 1, $$n(\lambda) = A + \frac{B}{\lambda^2} + \frac{C}{\lambda^4} \qquad \text{[Equation 1]}$$

wherein $n(\lambda)$ is a refractive index at a wavelength of $\lambda$, $\lambda$ is in a range of 300 nm to 1800 nm, and A, B and C are each a Cauchy parameter;

wherein the first region and the second region in the lowly refractive coating layer satisfy at least one of the following conditions 1 to 3:

[Condition 1]

wherein a difference between an A value for the first region and an A value for the second region is 0.2 or more;

[Condition 2]

wherein, the A value for the first region is in a range of 1.50 to 2.00; and

[Condition 3]

wherein the A value for the second region is in a range of 1.00 to 1.40.

10. A display device comprising an organic light emitting panel and the optical laminate of claim 1, wherein the optical laminate is attached to the organic light emitting panel via the pressure-sensitive adhesive layer.

11. The display device according to claim 10, comprising no retardation plate.

12. The display device according to claim 10, wherein the optical laminate is attached to a side of the organic light emitting panel, from which light is emitted, via the pressure-sensitive adhesive layer.

13. The display device according to claim 12, wherein the optical laminate is directly attached to the side of the organic light emitting panel, from which light is emitted, via the pressure-sensitive adhesive layer.

14. The display device according to claim 10, wherein an a* value of a reflective color coordinate system in a range of −2 to 2, and an b* value of the reflective color coordinate system is in a range of −2 to 2.

15. The optical laminate according to claim 1, wherein the haze of the pressure-sensitive adhesive layer as measured according to the standard of JIS K7105 is 40% or more.

16. The optical laminate according to claim 1, wherein the reflectance of the antireflection layer is 0.01% or more for light with a wavelength in a range of 380 nm to 780 nm.

17. The optical laminate according to claim 8, wherein the refractive index of the first region is 1.95 or less for light with the wavelength in a range of 400 nm to 700 nm.

* * * * *